United States Patent [19]

Yamazaki et al.

[11] 4,420,775
[45] Dec. 13, 1983

[54] CIRCUIT AND METHOD FOR PROTECTING A HORIZONTAL SYNCHRONOUS SIGNAL

[75] Inventors: Shigeru Yamazaki; Takao Arai; Masaharu Kobayashi, all of Yokohama; Takashi Hoshino, Fujisawa; Chitoshi Hibino; Harukuni Kobari, both of Yokohama, all of Japan

[73] Assignees: Nippon Victor Kabushiki Kaisha, Yokohama; Hitachi, Ltd., Tokyo, both of Japan

[21] Appl. No.: 305,779

[22] Filed: Sep. 25, 1981

[30] Foreign Application Priority Data

Sep. 26, 1980 [JP] Japan .............................. 55-132876
Sep. 26, 1980 [JP] Japan .............................. 55-133830

[51] Int. Cl.³ .......................... G11B 27/10; G11B 5/43
[52] U.S. Cl. ..................................... 360/38.1; 358/148; 358/314; 358/336; 358/339; 360/36.2; 360/37.1
[58] Field of Search ............... 358/314, 319, 336, 339, 358/148, 153, 155; 360/37.1, 38.1, 36.2, 36.1

[56] References Cited

U.S. PATENT DOCUMENTS 4,024,571 5/1977 Dischert et al. ................... 358/19 X
4,313,136 1/1982 Kimura .................................. 360/37
4,353,091 10/1982 Hoppe ................................. 358/139

FOREIGN PATENT DOCUMENTS 52-102613 8/1977 Japan .

Primary Examiner—Robert L. Richardson
Attorney, Agent, or Firm—Lowe, King, Price & Becker

[57] ABSTRACT

A circuit for protecting a horizontal synchronous signal comprises a horizontal synchronous signal detecting circuit responsive to horizontal synchronous pulses included in a composite synchronous signal of a reproduced PCM signal, first and second horizontal synchronous pulse supplementing or adding circuits and an output switching circuit. The output switching circuit operates so that the first supplementing circuit delivers a first supplementary pulse in the absence of a single pulse of the original horizontal synchronous signal, and the second supplementing circuit produces one or more second supplementary pulses in the absence of a plurality of continuous pulses of the original horizontal synchronous signal. When the circuit returns to a condition in which produced horizontal synchronous pulses are synchronous with the original horizontal synchronous pulses, the time interval between adjacent pulses of the original pulses is detected to see whether the interval is either longer or shorter than a predetermined value. As a result, when a pulse first appeared after the returning point is within the predetermined interval, that pulse is removed so that the number of output horizontal synchronous pulses is correct.

6 Claims, 21 Drawing Figures

| RESULTS OF SHRINKING/ EXPANSION DETERMINATION | RESULTS OF ODD/EVEN DETERMINATION | DETAILES OF PROCESSING |
|---|---|---|
| SHRINKING (DROPOUT) | ODD | REMOVE |
|  | UNDETERMINABLE | LEAVE AS IS |
|  | EVEN | LEAVE AS IS |
| EXPANSION (NOISE) | ODD | REMOVE |
|  | UNDETERMINABLE | REMOVE |
|  | EVEN | LEAVE AS IS |

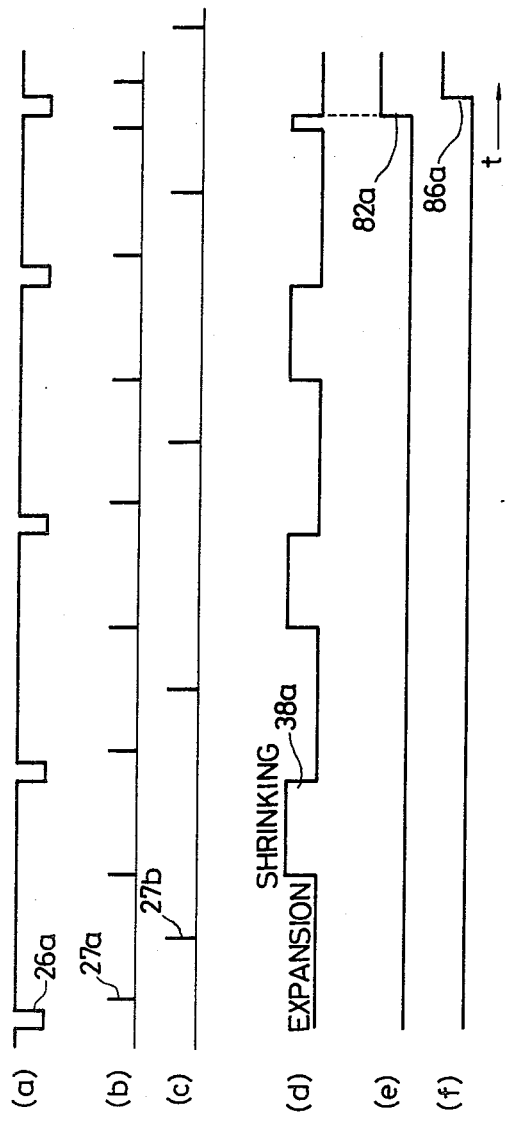
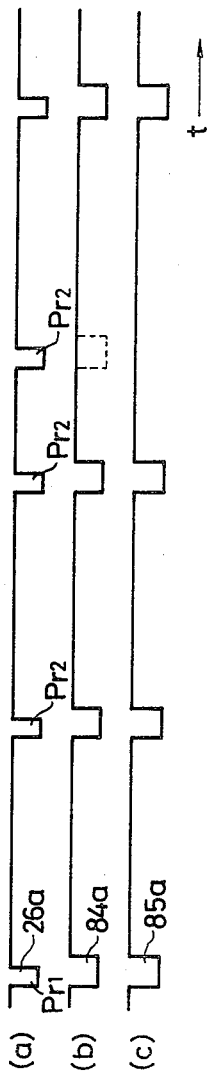
FIG. 19
FIG. 20

CIRCUIT AND METHOD FOR PROTECTING A HORIZONTAL SYNCHRONOUS SIGNAL

BACKGROUND OF THE INVENTION

This invention generally relates to a circuit and a method for protecting a horizontal synchronous signal in a PCM signal decoding apparatus for decoding or demodulating a PCM signal formed as a standard television signal.

A PCM (pulse code modulation) system has been adopted in place of conventional analog recording/reproducing techniques for recording and reproducing various information on and from a magnetic recording tape. In a PCM system, the frequency range and the dynamic range are respectively dependent on the sampling period and the number of quantization bits. Therefore, it is possible to widen the frequency range and the dynamic range to the extent permitted by the range of the recording medium and the conversion system. In order to satisfactorily perform PCM recording and reproducing, it is necessary to use a recording/reproducing apparatus having a wide frequency range. A video tape recorder (referred to as VTR hereafter) is usually used as the apparatus having the necessary wide frequency range.

Since VTRs have been popular, it is now the general practice to record and reproduce audio signals as PCM signals having the same or a similar format as a standard TV (television) signal. Various standards for the signal format and processing method of such a PCM signal, established in June, 1979 by Electronic Industries Association of Japan (an incorporated body), are found in technical file STC-007 titled "Consumer use PCM encoder-decoder" issued by the Association.

In a helical scan type VTR, one of two rotary heads is selectively used by switching. As a result of switching, the horizontal synchronous signal (referred to as H. synch hereafter) reproduced via such rotary heads has a tendency to suffer from undesirable skew phenomena. Namely, the time interval between adjacent H. synch pulses has a tendency to be much shorter or longer than a predetermined desired interval. The maximum error due to skew is 20 microseconds or so. In order to prevent the reproducing system from malfunctioning, an H. synch supplementing circuit has been employed for automatically compensating for any dropped H. synch pulse. Although the conventional H. synch supplementing circuit satisfactorily functions when the time interval between adjacent H. synch pulses is shorter than the predetermined interval, it operates in an undesirable manner when the time interval is longer than the predetermined interval. If the time interval between adjacent H. synch pulses is longer than the predetermined interval, the supplementing circuit malfunctions, by continuously dropping out H. synch pulses.

SUMMARY OF THE INVENTION

The present invention has been achieved in order to remove the above-mentioned drawback or disadvantage inherent to the conventional circuit arrangement and method for protecting H. synch in a PCM signal reproducing system.

It is, therefore, an object of the present invention to provide a circuit and method for correctly adding H. synch pulses if original H. synch pulses have been dropped or the phase of the pulses has deviated from a predetermined one.

Another object of the present invention is to provide stable operation for a PCM recording/reproducing apparatus.

In accordance with the present invention there is provided a horizontal synchronous signal protecting circuit for use with a pulse code modulated signal decoding apparatus which decodes a pulse code modulated signal accompanied by horizontal synchronous pulses which were originally added at a predetermined interval, comprising: (a) a horizontal synchronous signal detecting circuit responsive to an input signal carrying said horizontal synchronous pulses for detecting said horizontal synchronous pulses and for outputting detected horizontal synchronous pulses when each horizontal synchronous pulse appears within a predetermined time interval; (b) a first horizontal synchronous pulse adding circuit responsive to the output pulses of said horizontal synchronous signal detecting circuit for supplementing the absence of a horizontal synchronous signal with a first supplementary horizontal synchronous pulse in the absence of a horizontal synchronous pulse in said composite synchronous signal; (c) a second horizontal synchronous pulse adding circuit having a free-running counter, said free-running counter being reset to zero in response to a horizontal synchronous pulse from said horizontal synchronous signal detecting circuit, said second horizontal synchronous pulse adding circuit producing second supplementary horizontal pulses; and (d) an output switching circuit for selectively transmitting one of the output signals of said horizontal signal detecting circuit and said first and second horizontal synchronous pulse adding circuits in accordance with the number of horizontal synchronous pulses dropped from said input signal; said output switching circuit outputting a first supplementary horizontal synchronous pulse from said horizontal synchronous pulse adding circuit when the dropped out pulse number is one, and outputting said second horizontal synchronous pulses from said second horizontal synchronous pulse adding circuit when the horizontal synchronous pulses of said input signal have been continuously dropped.

In accordance with the present invention there is also provided a method of protecting a horizontal synchronous signal of a pulse code modulated signal derived from a recording medium, which PCM signal had been recorded as a standard interleaved television signal by converting an analog signal into a pulse code modulated signal and by mixing the pulse code modulated signal with a synchronous signal based on a scanning standard of a standard television system, said method including the step of adding first and second supplementary horizontal synchronous pulses in such a manner that the first supplementary horizontal synchronous pulse is added when a horizontal pulse of the synchronous signal is not detected, and the second supplementary horizontal pulses are added when horizontal pulses of the synchronous signal are not detected continuously, said adding step comprising: (a) determining whether the interval between adjacent horizontal synchronous pulses of said synchronous signal at the time of returning from a condition that horizontal synchronous pulses are added to a condition of synchronizing with the horizontal synchronous pulses of the synchronous signal, is longer or shorter than a predetermined value; and (b) removing a first derived pulse of said second supplementary pulses, which appears at the time of returning to said condition, by utilizing the results of the determining step when said first derived pulse is within a predetermined time interval.

BRIEF DESCRIPTION OF THE DRAWINGS

The object and features of the present invention will become more readily apparent from the following detailed description of the preferred embodiments taken in conjunction with the accompanying drawings in which:

FIGS. 19 and 20 are timing charts useful for understanding the operation of the second embodiment circuit of FIG. 18.

The same or corresponding elements and parts are designated as like numerals throughout the drawings.

DETAILED DESCRIPTION OF THE INVENTION

Prior to describing the embodiments of the present invention, the background of the invention is further discussed for a better understanding of the object and features of the present invention.

Figure 1:
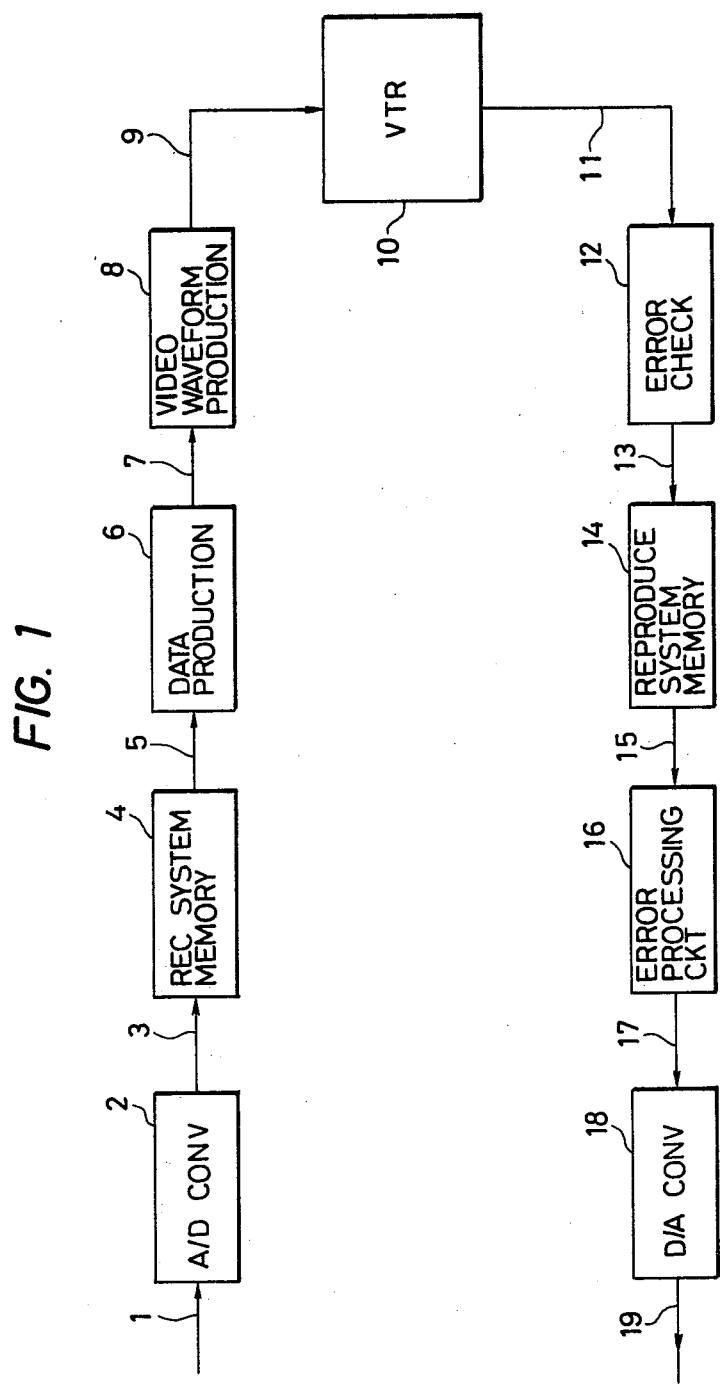
FIG. 1 is a schematic block diagram showing a PCM recording/reproducing apparatus to which the present invention is applicable.

FIG. 1 is a schematic block diagram of a PCM recording/reproducing system to which the present invention is applicable. In FIG. 1, an analog signal 1 is first converted into a digital signal 3 by an A/D (analog to digital) converter 2. The digital signal 3 is sequentially stored in and read from a recording system memory 4. The data is time compressed by reading out the stored data during an interval shorter than that use for storing. Time-compressed data 5 is applied to data producing circuit 6 to be added with data for correcting errors and with data for detecting errors, and thus recording digital data 7 is emitted from the data producing circuit 6. The recording digital data 7 is added with a horizontal/vertical synchronous signal in a video wave producing circuit 8 so as to be recorded by a VTR 10 as a video signal 9.

A video signal 11 derived from the VTR 10 is applied to an error checking circuit 12 in which error checking is performed to add an error checking signal to the digital data. The output data 13 of the error checking circuit 12 is sequentially stored in a reproducing system memory 14. By reading out the data 15 stored in the reproducing system memory 14 over an interval longer than the period for recording, the data is expanded with respect to time. The time-expanded data 15 from the reproducing memory 14 is applied to an error processing circuit in which data errors are corrected in accordance with the error checking signal so that a corrected signal 17 is obtained. The corrected signal 17 is applied to a D/A (digital to analog) converter 18 to be converted into an analog signal 19.

In the above-described PCM recording/reproducing system, the horizontal/vertical synchronous signal is used as an origin for timing various operations. Therefore, if the synchronous signal is missing, malfunctions are apt to occur. The horizontal synchronous signal is a composite syschronous signal is readily affected by skew caused by switching of two rotary heads in a helical scan VTR. Therefore, it is especially necessary to provide a correct horizontal synchronous signal if the original horizontal synchronous signal pulses have been dropped or the phase thereof has been undesirably shifted because the horizontal synchronous signal is used as a basis for producing a vertical synchronous signal. Since the vertical synchronous signal is very important for accurately decoding a PCM signal, detection and protection thereof must be performed with high accuracy.

Figure 2:
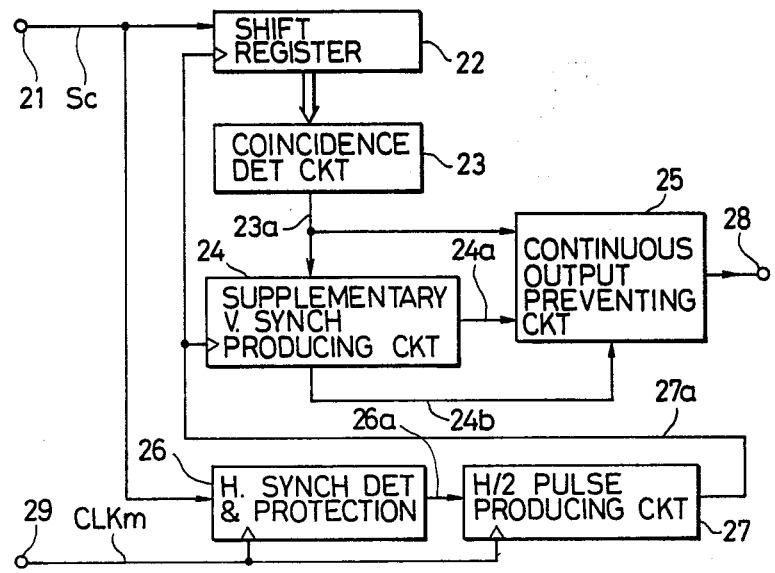
FIG. 2 is a schematic block diagram of a conventional vertical synchronous signal protecting circuit including a H. synch protecting circuit.
Figure 3:
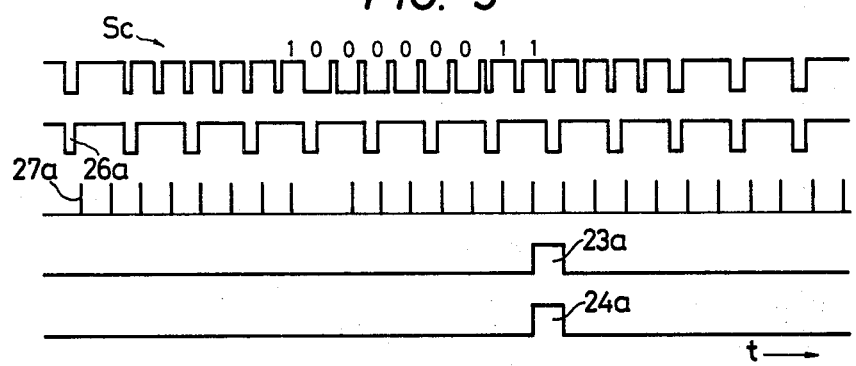
FIGS. 3 and 4 are timing charts useful for understanding the operation of the conventional circuit of FIG. 2.
Figure 4:
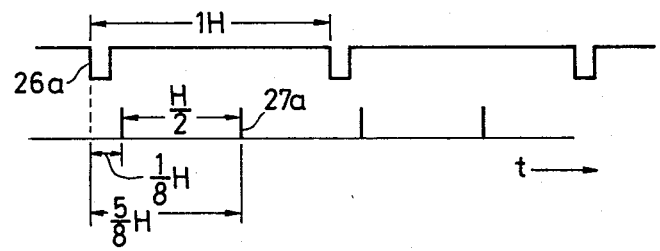

FIG. 2 is a schematic block diagram of a conventional vertical synchronous signal (referred to as V. synch hereafter) detecting and protecting circuit. FIGS. 3 and 4 are timing charts useful for understanding the operation of the circuit of FIG. 2. In FIG. 2, the input terminal 21 receives a composite synchronous signal Sc, having a waveform shown in FIG. 3. The composite synchronous signal Sc is obtained by extracting it, by synchronous separation, from a PCM signal derived from a VTR with which a PCM signal is recorded and played back in the form of a TV (television) signal of the type of standard TV system. The composite synchronous signal Sc is applied to a shift register 22 and to a horizontal synchronous signal (referred to as H. synch hereafter) detecting and protecting circuit 26 (the reference H indicates a time interval of a single horizontal synchronizing period).

The H. synch detecting and protecting circuit 26 is supplied with a master clock pulse train signal CLKm (having a frequency of 2.643 MHz in the case of a PCM signal based on the format defined by the technical file STC-007). The function of the H. synch detecting and protecting circuit 26 is to detect H. synch pulses from the composite synchronous signal Sc applied to the input terminal 21, and to protect the same so that an H. synch 26a (waveform illustrated in FIG. 3) is emitted therefrom as an output to be applied to an H/2 pulse producing circuit 27.

The H/2 pulse producing circuit 27 comprises a counter, a decoder etc. The counter (not shown) starts counting the number of the master clock pulses CLKm from the instant of the leading edge of the H. synch 26a, so that an H/2 pulse train signal 27a having a frequency twice that of the H. synch 26a is produced, as seen in FIG. 4, by producing pulses of, for instance, H/8 and 5H/8, after counting the master clock pulses CLKm of 2.643 MHz to 21 and 105 respectively (a time interval between adjacent H. synch pulses 26a, i.e. a length of 1H, corresponds to 168 pulses of the master clock pulses CLKm.).

The H/2 pulse signal 27a (see FIG. 3) from the H/2 pulse producing circuit 27 is applied to the shift register 22 as a shifting pulse, and is applied to a supplementary V. synch producing circuit 24. Coincidence detecting circuit 23 derives a coincidence pulse 23a (see FIG. 3) of substantially H/2 pulse width that is produced when the stored contents in the shift register 22 coincide with a given pattern or code, such as 100000011. The coincidence pulse 23a is applied to the supplementary V. synch producing circuit 24 and to a continuous output preventing circuit 25. The above-mentioned coincidence signal 23a is hereafter referred to as a pattern V. synch.

The supplementary V. synch producing circuit 24 comprises a divide-by-525 counter and a decoder. Circuit 24 counts 525 of the H/2 pulses 27a applied thereto so that a supplementary V. synch signal having a single vertical synchronizing period, i.e. 262.5 H, can be obtained. The divide-by-525 counter of the supplementary V. synch producing circuit 24 is reset by the above-mentioned pattern V. synch 23a so that it emits a pulse signal 24a having a width of substantially H/2 at an instant when a pulse of the pattern V. synch 23a should appear even if the pattern V. synch 23a has not been emitted from the coincidence circuit 23 due to dropout or the like. In the following description, the signal 24a is referred to as a supplementary V. synch.

The continuous output preventing circuit 25, to which the pattern V. synch 23a and the supplementary V. synch 24a are respectively applied, feeds only a signal existing at a desired correct time position as a V. synch to an output terminal 28. Even if the time position of pattern V. synch 23a and the supplementary V. synch 24a only slightly deviate or are shifted from each other there is a difference therebetween of two vertical synchronous signals which would be undesirably emitted. The continouous output preventing circuit 25 avoids such continuous emission of the two vertical synchronous signals. Furthermore, the continuous output preventing circuit 25 is also responsive to a signal 24b from the supplementary V. synch producing circuit 24 so that an erroneous output signal residing in other than the vicinity of the V. synch of the composite synchronous signal Sc is prevented from being emitted.

Figure 5:
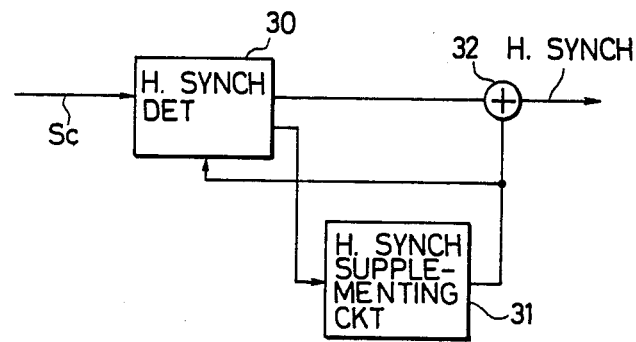
FIG. 5 is a schematic block diagram of the H. synch protecting circuit included in the V. synch protecting circuit of FIG. 2.
Figure 6:
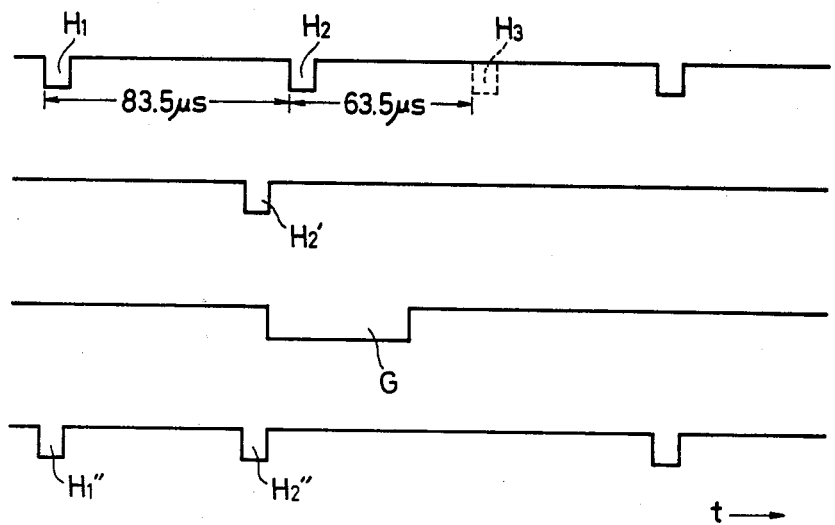
FIG. 6 is a timing chart useful for understanding the operation of the conventional circuit of FIG. 5.

Reference is now made to FIG. 5, a circuit diagram of the H. synch detecting and protecting circuit 26 of FIG. 2. FIG. 6 is a timing chart useful for understanding the operation of the conventional circuit of FIG. 5 that includes H. synch detecting circuit 30 and supplementing circuit 31. The H. synch detecting circuit 30 detects a pulse H1 or H. synch from the composite synchronous signal Sc as shown in FIG. 6, and includes a gate that is closed for a suitable time (for instance, 62 microseconds) to prevent noise from being detected as a synchronous signal for a time interval (i.e. 1H) between adjacent H. synch pulses (1H corresponds to 63.56 microseconds and to 168 pulses of the 2.643 MHz master clock pulses CLKm). After the 62 microsecond interval, the gate is opened to wait for an interval corresponding to ten clock pulses or so until a subsequent H. synch pulse is detected. If no H. synch pulse is detected, the supplementing circuit 31 is actuated to add an H. synch pulse H2' as shown in FIG. 6. Thus, the output signal of the supplementing circuit 31 is added to the output signal of the detecting circuit 30 by an adder 32 to obtain a corrected H. synch as shown in the bottom waveform in FIG. 6. Namely, a supplemented output pulse H2" is positioned at the correct time position after the pulse H1"; the time position of pulse H1 corresponds to that of the pulse H1. In the example of the input H. synch pulses H1 and H2 of FIG. 6, the pulse H2 would be also emitted after the emission of the pulse H2', resulting in an increase in the number of H. synch pulses. In order to prevent such undesirable phenomena, the gate included in the H. synch detecting circuit 30 is closed for a suitable interval, such as 40 microseconds or so, defined by a gate pulse G (see FIG. 6) immediately after emission of the supplemented pulse H2". In order to produce the pulse G, the output signal of the supplementing circuit 31 is connected to the H. synch detecting circuit 30.

By employing the above-described conventional H. synch detecting and protecting circuit of FIG. 5, H. incorrectly positioned or dropped synch pulses are supplemented so as to emit an output signal having H. synch pulses spaced substantially equidistant and at substantially the correct positions. However, when two or more H. synch pulses are continuously dropped, the circuit of FIG. 5 has a tendency to malfunction inasmuch as the circuit of FIG. 5 waits until a subsequent H. synch pulse is detected after supplementing an H. synch pulse. The reference H3 in FIG. 6 is a dropped H. synch pulse which cannot be supplemented by the supplementing circuit 31. Accordingly, no H. synch pulse corresponding to H3 is included in the output H. synch signal of the adder 32.

As described at the beginning of this specification, the present invention provides an H. synch protecting circuit which is capable of adding H. synch pulses even if original H. synch pulses have been dropped for a relatively long period of time.

Figure 7:
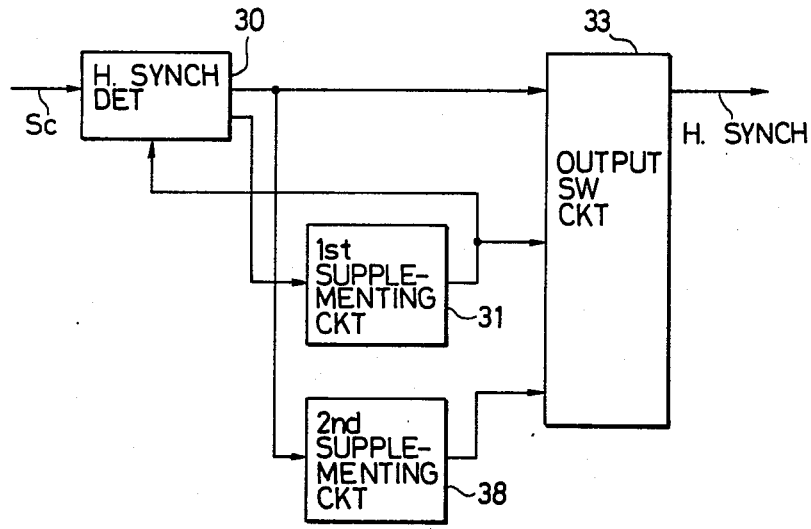
FIG. 7 is a schematic block diagram of a first embodiment of the H. synch protecting circuit according to the present invention.

Hence, reference is now made to FIG. 7, a block diagram of a first embodiment of the H. synch protecting circuit according to the present invention. According to the present invention first and second supplementing or adding circuits are employed. The first supplementing circuit corresponds to the conventional circuit 31 of FIG. 5, for adding a single H. synch pulse, while the second supplementing circuit adds H. synch pulses when two or more original H. synch pulses are not deteted.

Figure 11:
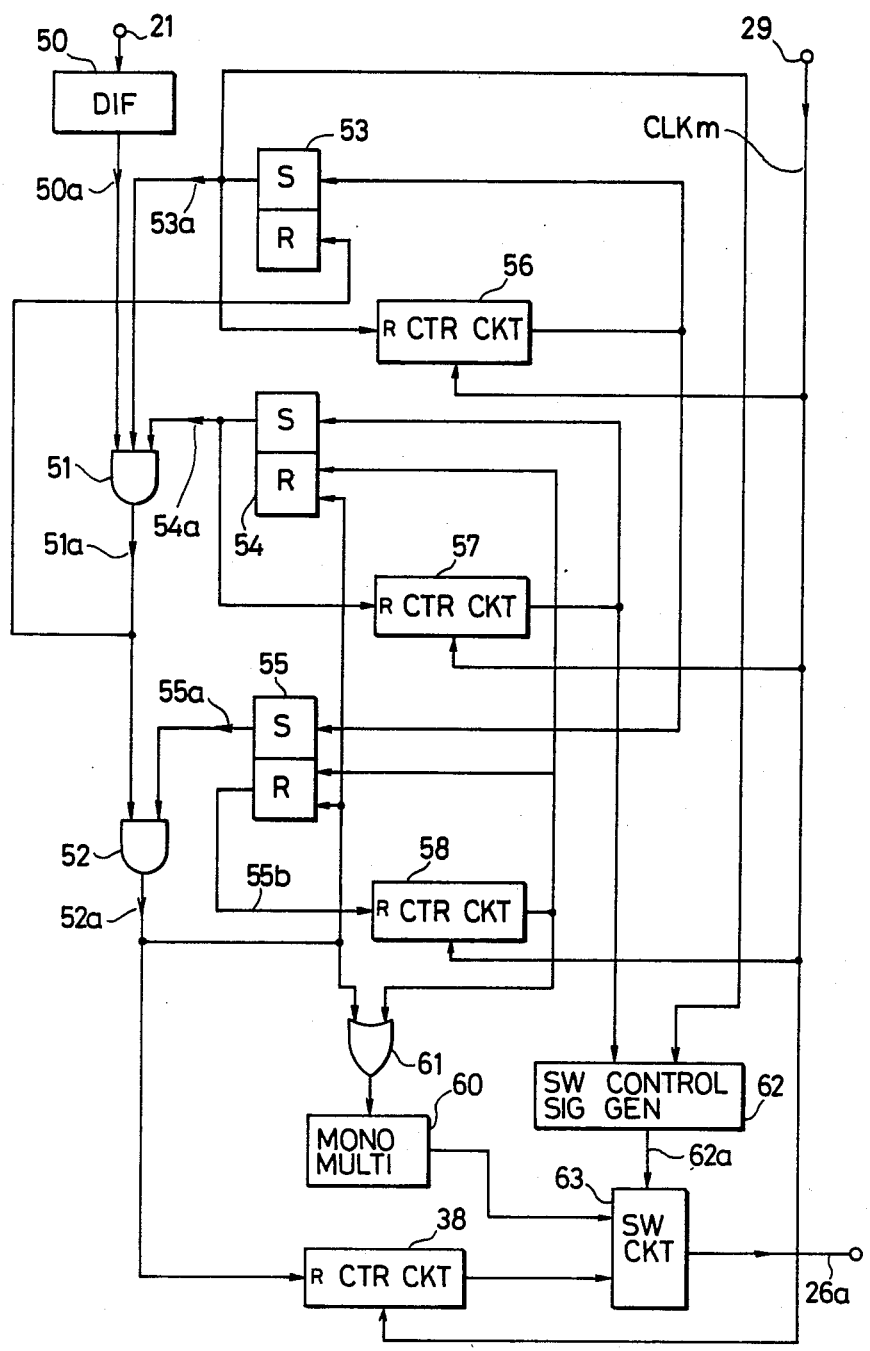
FIG. 11 is a detailed circuit diagram of the circuit of FIG. 7.

The first embodiment H. synch protecting circuit of FIG. 7 comprises an H. synch detecting circuit 30, a first supplementing circuit 31, a second supplementing circuit 38 and an output switching circuit 33. The circuit of FIG. 7 is schematically illustrated so that the general operation of the circuit will be understood; a detailed structure of the circuit is illustrated in FIG. 11. The H. synch detecting circuit 30 and the first supplementing circuit 31 respectively correspond to those in FIG. 5.

Figure 8:
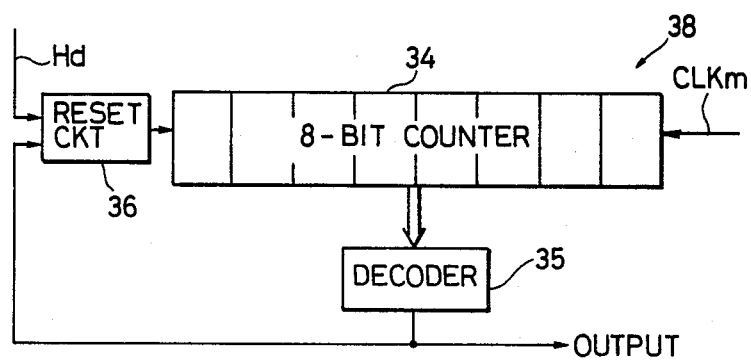
FIG. 8 is a detailed circuit diagram of the second H. synch supplementing circuit of FIG. 7.

The newly introduced second supplementing circuit 38 comprises a divide-by-168 counter which is constructed of an 8-bit counter 34. In addition to the counter 34, the second supplementing circuit 38 comprises, as shown in FIG. 8, a 13-168 decoder 35 and a resetting circuit 36 having an AND gate, which practically operates as an OR gate in negative logic, and a differentiator. Since the H. synch pulse occurs at an interval corresponding to 168 pulses of the master clock pulses CLKm and has a width corresponding to 13 pulses of the same, H. synch pulses can be continuously emitted from such a divide-by-168 counter if the counter runs all the time. As seen in FIG. 8, the resetting circuit 36 receives the original H. synch pulse Hd, and has an output connected to a reset terminal of the 8-bit counter 34. The counter 34 is responsive to the master clock pulses CLKm, and emits output data indicative of the counter number. The output data is fed to the 13–168 decoder 35 which produces an output signal in accordance with the result of decoding. When the output data of counter 34 indicates 13, the output signal of the decoder 35 assumes logic "1", and this logic "1" is kept until the counter output data indicates 168. Since the output signal of the decoder 35 is fed to the resetting circuit 36, the resetting circuit 36 produces a reset pulse when the original H. synch pulse Hd or the output pulse of the decoder 35 is fed thereto. Accordingly, the counter 34 is periodically reset to zero whenever the counted number reaches 168 so that the counter 34 functions as a free-running counter. Furthermore, the counter 34 is also reset to zero in response to the original H. synch pulse Hd. Since the original H. synch pulses applied to the H. synch detecting circuit 30 FIG. 7 are gated as described above, only H. synch pulses Hd occurring at the correct time positions are applied to the resetting circuit 36. Thus, the counter 34 is reset to zero at a desired correct time by such an original H. synch pulse Hd occuring at the correct time position. Therefore, if counter 34 has been periodically reset by the output pulses of the decoder 35 in the absence of the original H. synch pulses, the counter is reset to zero by a correct H. synch pulse Hd which is applied after the absent interval, causing the counter 34 thereafter to produce output pulses at the correct time positions. In other words, the free-running period of the counter 34 is forcibly reset to zero to correct the period by the H. synch pulse Hd so that the operating timing of the counter 34 is synchronous with the original H. synch pulses Hd.

The output switching circuit 33 is responsive to three input signals respectively from the Hy. synch detecting circuit 30 and the first and second supplementing circuits 31 and 38. Circuit 33 emits one of the three input signals. Such a switching circuit may be readily constructed of gate circuits.

Figure 9:
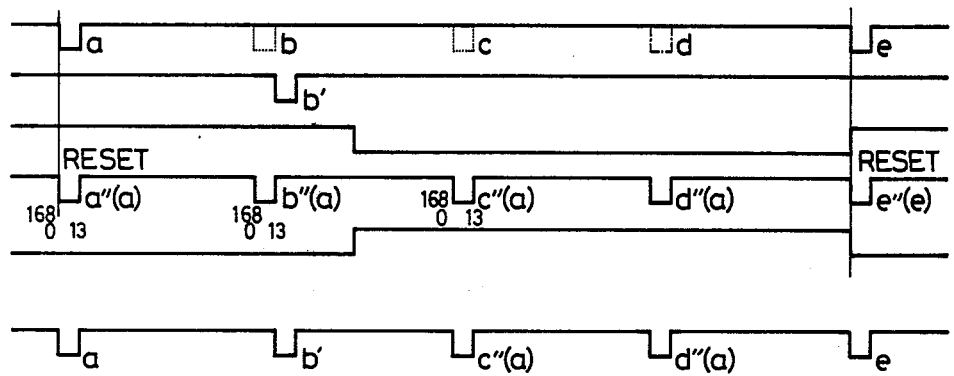
FIGS. 9 and 10 are timing charts useful for understanding the operation of the circuit of FIG. 7.
Figure 10:
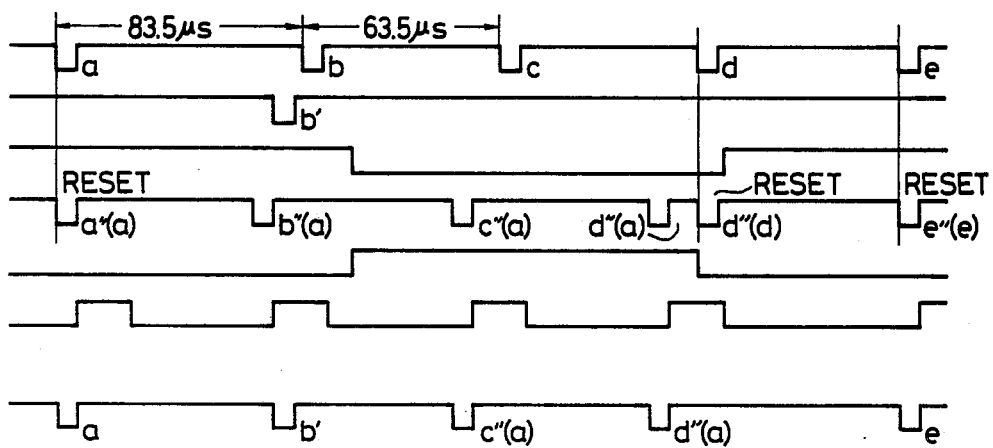

The operation of the H. synch protecting circuit of FIG. 7 is further described with reference to the timing charts of FIGS. 9 and 10. In FIGS. 9 and 10, the references a, b, c, d and e of the first waveform are H. synch pulses from the H. synch detecting circuit 30. Dropped pulses b and c are shown by dotted lines. The pulse d, shown by a dot-dash line, is not actually included in the signal from the H. synch detecting circuit 30 although the pulse d was included in the composite synchronous signal Sc applied thereto. The second waveform including a pulse b' is the output signal of the first supplementing circuit 31, while the third waveform is a gating signal for controlling the gate of the output switching circuit 33. The fourth waveform including pulses a", b", c", d" and e" is the output signal of the second supplementing circuit 38, namely, the output signal of the decoder 35 of FIG. 8, while the fifth waveform is a gating signal for controlling another gate of the output switching circuit 33. The sixth waveform including pulses a, b', c", d" and e is the output signal from the output switching circuit 3. The output pulses a", b" . . . in the fourth waveform are indicated as a"(a), b"(a) . . . . The references in the brackets show that the output pulses of the second supplementing circuit 38 are produced by divide-by-168 counter 34 reset by a reset pulse having a time position based on a detected H. synch pulse a having the same references as those in the brackets. It will be understood from the fourth waveform of FIG. 9, that pulses a", b", c" and d" from the second supplementing circuit 38 are synchronous with the original H. synch pulse a of the first waveform, and pulse e" is synchronous with an original H. synch pulse e. Although the original pulse d is applied to the H. synch detecting circuit 30, it is not emitted therefrom as described in and the above, the counter 34 is not reset by the original pulse d but by pulse d" from the decoder 35. Therefore, only when two consecutive original H. synch pulses are applied to the H. synch detecting circuit 30, is counter 34 reset to zero by the original H. synch signal Hd (i.e. the pulse e in this case). In other words, the H. synch pulses applied to the H. synch detecting circuit 30 are regarded as correct pulses only when two consecutive H. synch pulses are detected.

In the output switching circuit 33, the output signals from the first and second supplementing circuits 31 and 38 are selectively passed therethrough in accordance with the gating signals (see the third and fifth wavegforms of FIG. 9) which can be produced by detecting the output pulse b' of the first supplementing circuit 31. Namely, the gate for the output signal from the first supplementing circuit 31 is closed for a given period of time after the occurrence of the pulse b', and the other gate for the output signal from the second supplementing circuit 38 is opened simultaneously. With this arrangement, the output switching circuit 33 is capable of emitting the output signal shown in the sixth waveform in FIG. 9.

Although the operation of the circuit of FIG. 7 has been described by assuming that H. synch pulses have been dropped, if the time interval between adjacent H. synch pulses is longer than the predetermined value, as shown in the first waveform of FIG. 10, the width of the gating signal for the output signal of the second supplementing circuit 38 may be shortened from that of FIG. 9, to the interval shown in the fifth waveform of FIG. 10. By setting the width of the gating signal shorter, the pulse d"(d), produced by resetting the counter 34 by the original H. synch pulse d, is not emitted from the output switching circuit 33.

Another method for preventing such undesirable phenomena employs a pulse generator responsive to the output pulses from the second supplementing circuit 38. The output pulses of the pulse generater are applied to the gate circuit for the second supplementing circuit 38 so that an output pulse of the second supplementing circuit 33 is rejected for a given interval, such as 20 microseconds, after a former pulse has been emitted. The sixth waveform of FIG. 10 shown the above-mentioned gating pulse for rejecting the output pulse of the second supplementing circuit 33. In FIG. 10, the first to fourth waveforms respectively correspond to those of FIG. 9, while the seventh waveform representing the output signal of the output switching circuit 33 corresponds to the sixth waveform of FIG. 9.

The first embodiment H. synch protecting circuit, schematically shown in FIG. 7, is further described with reference to the detailed circuit diagram of FIG. 11 and the timing chart of FIG. 12 useful for understanding the operation of the circuit of FIG. 11. In FIG.

Figure 12:
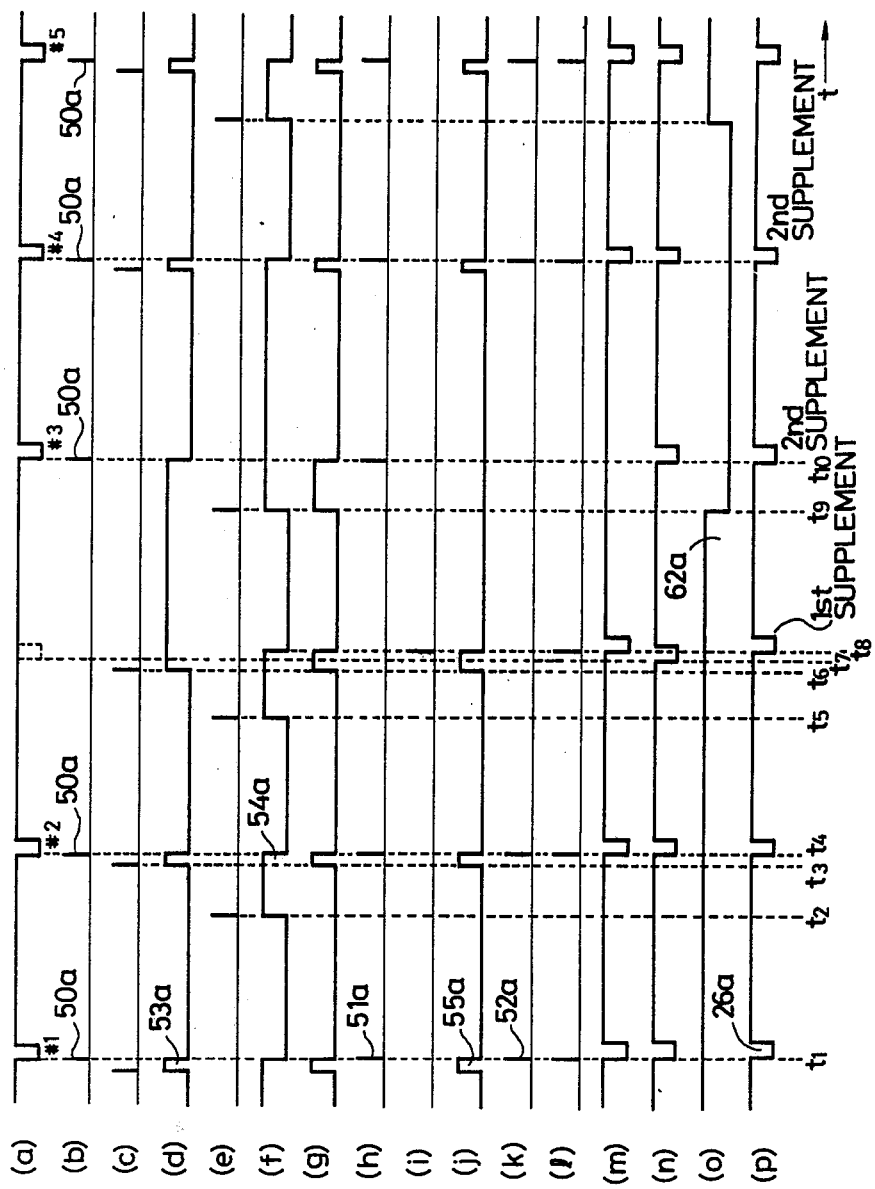
FIGS. 12 to 16 are timing charts useful for understanding the operation of the circuit of FIG. 11.

11, differentiator 50 is responsive to the composite synchronous signal Sc (see the waveform (a) of FIG. 12) for producing a differential pulse 50a (the waveform (b)) in response to the leading or trailing edges of the pulses of the composite synchronous signal Sc. Although the differentiator 50 is not needed in an actual circuit arrangement, it is shown for the description of the operation.

The basic idea of the detection, protection and supplement of H. synch pulses in the circuit arrangement of FIG. 11 is as follows. If a subsequent differential pulse 50a 1 is detected within a short time period $2\Delta H$ which starts at the instant that an interval $1H-\Delta H$ has lapsed from the detection of a former differential pulse 50a derived from the H. synch pulses included in the composite synchronous signal Sc, the detected differential pulse 50a is considered as positioned at the correct time position to emit an H. synch pulse that is synchronous with this differential pulse 50a.

In the above, $\Delta H$ may be set to an interval corresponding to the time variation which occurs in the reproduced composite synchronous signal Sc due to the speed variation of the magenetic recording tape of the VTR, for instance, $\Delta H$ may be set to several percent numbers of 1H.

On the other hand, if the subsequent differential pulse 50a1 is not detected within the time interval $2\Delta H$ (i.e. $\pm \Delta H$) which starts at the instant that an interval $1-\Delta H$ has been lapsed from the detection of the former differential pulse 50a, such detection failure is regarded as likely undetection caused by skew inherent to the VTR. In this case, a first supplemenray H. synch pulse is emitted for the time being. Then detection of a next coming differential pulse 50a is started before the instant that interval $1H-\Delta H$ would have elapsed by measuring the time from the detection point of the first supplementary H. synch pulse.

If a subsequent differential pulse 50a is not detected within a time interval $2\Delta H$ starting from the instant that the interval $1H-\Delta H$ has elapsed, a second supplementary H. synch pulse is emitted, and this operation will be repeated. When a subsequent differential pulse 50a is detected within a time interval $1H-\Delta H$, the H. synch protecting circuit is returned to a state in which normal H. synch pulses are produced from the detection time of a differential pulse 50a subsequent to the first detected differential pulse 50a.

The circuit of FIG. 11 includes AND gates 51 and 52, as well as flip-flops 53-55 actuated by a positive pulse. Each of counter circuits 56-58 includes a counter and a decoder which is capable of emitting a positive pulse in accordance with a specific counted value from the counter. Each of the counters of the counter circuits 56 to 58 has a reset terminal R so that the counter is reset to zero by a positive pulse.

In FIG. 12, the H. synch pulses of the composite synchronous signal Sc (see the waveform (a)) are designated as #1, #2, #3 . . . to distinguish them from each other. The differential pulse 50a (waveform (b)) corresponding to #1 from the differentiator 50 is transmitted through the first and second AND gates 51 and 52 as pulses 51a and 52a in FIG. 11 of waveforms (h) and (k). The transmitted differential pulse 50a is applied via an OR gate 61 (see the waveform (1)) as a trigger to a one-shot or monostable multivibrator 60. As a result, the monostable multivibrator 60 emits an H. synch output pulse at time t1.

The differential pulse 50a resets the flip-flops 53 to 55; and therefore, the first and second AND gates 51 and 52 are closed immediately after t1. The opening time intervals of the first and second AND gates 51 and 52 are respectively indicated by the high levels of waveforms (g) and (j).

The flip-flop 54 is set at time t2 by the output signal (waveform (e)) of the counter circuit 57, and the output signal (waveform (f)) of the flip-flop 54 is applied as an enabling signal to the first AND gate 51. At time t3 the flip-flops 53 and 55 are set by the output signal (see waveform (c)) of the counter circuits 56, and the output signal 53a (waveform (d)) of the flip-flop 53 is applied as the other enabling signal to the first AND gate 51. Furthermore, the output signal 55a (see waveform (j)) of the flip-flop 55 is applied as an enabling signal to the second AND gate 52.

At time t4 a differential pulse 50a corresponding to #2 is applied via the first and second AND gates 51 and 52 and the OR gate 61 to as a trigger pulse the monostable multivibrator 60 in the same manner as the above-described differential pulse 50a corresponding to a #1. Accordingly, the monostable multivibrator 60 emits an H. synch pulse at time t4.

It will be understood from the above, description that the counter circuit 56 sets or defines the aforementioned time interval $1H-\Delta H$, while the counter circuit 57 detects differential pulse 50a before the end of the interval $1H-\Delta H$ if skew occurs.

If the original H. synch pulses exist in the composite synchronous signal without being dropped, each of the differential pulses 50a produced based on the original H. synch pulses occurs within a short period of time after occurrence of the output pulse of the counter circuit 56. Since the monostable multivibrator 60 is triggered by such differential pulses 50a, the H. synch pulses are sequentially emitted from the monostable multivibrator 60.

However, if some of the H. synch pulses have been dropped from the composite synchronous signal Sc for some reason, no differential pulses 50a are emitted from the differentiator 50. In order to supplement dropped H. synch pulses, the circuit arrangement of FIG. 11 operates as follows, assuming that an H. synch pulse, which ought to occur at time t7, has been dropped.

After an H. synch pulse is produced by the monostable multivibrator at time t4, the output pulse of the counter circuit 57 occurs at time t5 to set the flip-flop 54, causing the flip-flop 54 to produce an output 54a. At time t6, the flip-flops 53 and 55 are reset by the output pulse of the counter circuit 56, to supply binary one pulses 53a and 55a to first and second AND gates 51 and 52. However, since an original H. synch pulse, which ought to exist at time t7, is missing from the composite synchronous signal Sc, no differential pulse 50a is emitted from the differentiator 50 as described in the above.

Accordingly, no output pulse 51a is emitted from the first AND gate 51 (see waveform (h) of FIG. 12), so flip-flop 53 stays in its set condition. The flip-flops 54 and 55 are respectively reset by the output pulse (see waveform (i)) of the counter circuit 58 at time t8, and the first and second AND gates 51 and 52 are accordingly disabled, i.e., closed. Simultaneously, the output pulse of the counter circuit 58 is applied via the OR gate 61 to the monostable multivibrator 60 as a triger pulse, and therefore, the monostable multivibrator 60 emits a first supplementary H. synch pulse at time t8. This counter circuit 58 operates as a counter that measures the aforementioned time interval 2ΔH. The flip-flops 54 and 55 are also reset by the output pulse 52a (waveform (k)) of the second AND gate 52, while the counter circuit 58 is reset by the output pulse 55b of the flip-flop 55. The counter circuit 58 produces an output pulse when a predetermined number of the master clock pulses CLKm has been counted, which output pulse is applied via the OR gate 61 to the monostable multivibrator 60 to trigger the same. The output pulse of the counter circuit 58 is also applied as a reset to the flip-flops 55 and 54.

At time t9 the output pulse of the counter circuit 57 is emitted to set the flip-flop 54. At this time since the flip-flop 53 is in a set condition, the first AND gate 51 opens from time t9 which is before the end of the time interval 1H-ΔH (see waveform (g)).

In the above described example of FIG. 12, it has been assumed that an original H. synch pulse of time t7 was totally dropped. However even if the state of an original H. synch pulse is such that it has been shifted back or forth due to skew so that the time interval between adjacent H. synch pulses is shorter or longer than a predetermined value, the first AND gate 51 is opened before the end of the time interval 1H-ΔH in the same manner as in the described case because the differential pulse corresponding to the shifted H. synch pulse is not detected within a time interval 2ΔH although such differential pulse has been produced. It is necessary to open the first AND gate 51 before the end of the time interval 1H-ΔH since the position of the differential pulse 50a of a such a shifted H. synch pulse #3 deviates from the position of the differential pulse 50a of the waveform (b) of FIG. 12 on the time axis.

Although a differential pulse 50a of H. synch pulse #3 appearing at time t10 is coupled through the first AND gate 51, it cannot be transmitted through the second AND gate 52 since of the second AND gate is disabled due to the reset condition of the flip-flop 55. Furthermore, the counter circuit 58 is in reset condition at time t10 so that no output is emitted therefrom. Accordingly, no trigger pulse is applied via the OR gate 61 to the monostable multivibrator 60 at time t10.

In this case, an output signal of a counter circuit 38, (corresponding to the second supplementing circuit 38 of FIG. 7), reset by the output pulse 52a of the second AND gate 52 is used as a second supplementary H. synch pulse. The counter circuit 38 includes a free-running counter 34 as described with reference to FIG. 8.

After the differential pulse 50a corresponding to #3 has been detected at time t10, differential pulses corresponding to H. synch pulses #4 and #5 are detected in the same manner as described in connection with the operation between time t1 and t5.

The circuit of FIG. 11 also includes switching control signal generating circuit 62 and switching circuit 63 substantially corresponding to the output switching circuit 33 of FIG. 7. The switching circuit 63 selects one input signal applied to it from the monostable multivibrator 60 and the counter circuit 38 in accordance with the value of a switching control signal 62a derived from the switching control signal generating circuit 62.

The switching control signal generating circuit 62 utilizes the output signals of the flip-flop 53 and the counter circuit 57 as information for controlling switching time. Since the flip-flop 53 is in a set condition for some time after time t6 when no differential pulse 50a has been detected within a time interval 2ΔH as shown by the waveform (d) of FIG. 12, a desirable switching control signal is obtained by utilizing this fact by storing switching information by using the output signal of the counter circuit 57.

Waveform (o), FIG. 12, the waveform of switching control signal 62a, controls switching circuit 63 so circuit 63 respectively derives replicas of the output signals of the monostable multivibrator 60 and of the counter circuit 38 when the switching control signal 62a has high and low levels. The output signal of the switching circuit 63 is emitted as an H. synch pulse train signal 26a. The H. synch pulse train signal 26a from the switching circuit 63 includes first and second supplementary H. synch pulses. Therefore, H. synch pulse train signal 26a is more stable than the original H. synch pulses included in the composite synchronous signal Sc.

Although the circuit of FIG. 11 satisfactorily operates under usual conditions, it can produce an undesirable phenomena that the H. synch pulses are shifted by H/2 from the desired correct positions thereof under peculiar conditions, i.e. (1) if there is a relatively large skew, such as over 15 microseconds, in the vicinity of V. synch; (2) if a given noise pattern has been mixed in the composite synchronous signal Sc in the vicinity of the V. synch or the synchronous signal has been dropped from a given pattern.

The undesirable phenomena occur in the vicinity of the V. synch in both the above-mentioned cases (1) and (2), because an equalizing pulse adjacent the H. synch pulse is erroneously detected in the presence of skew and/or noises because equalizing pulses have been added to the composite synchronous signal Sc in the vinicity of the V. synch thereof at an interval of H/2.

Figure 13:
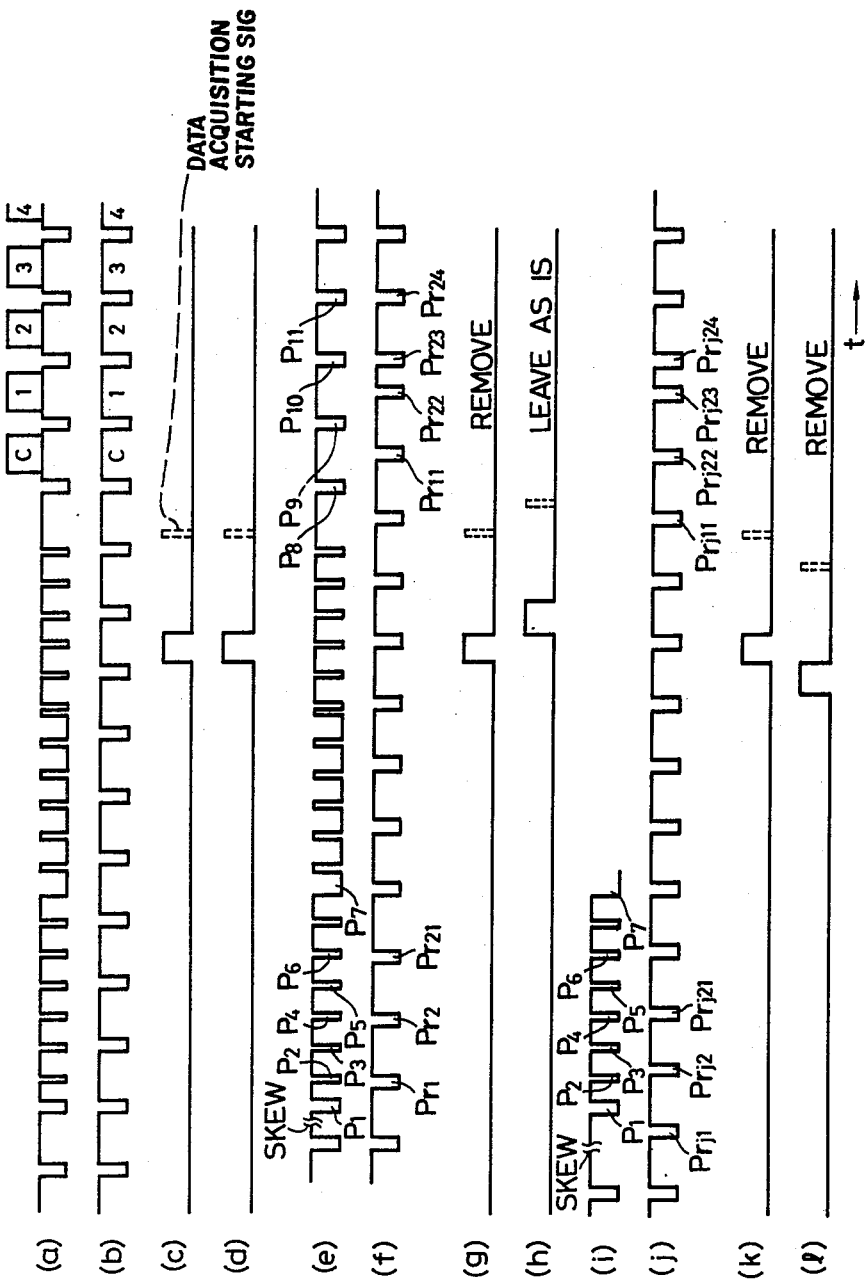

This point is described with reference to FIGS. 13 to 16. FIG. 13 is a timing chart of the operation in the vicinity of the V. synch included in the composite synchronizing signal when the two rotary VTR heads are switched from an odd to an even field. Waveforms (a) to (d) of FIGS. 13 to 16 are explanatory diagrams for a normal composite synchronous signal Sc; waveforms (e) to (h) of FIGS. 13 and 14 are explanatory diagrams of the composite synchronous signal for time shrinking due to skew; and waveforms (i) to (l) of FIGS. 13 and 14 are explanatory diagrams of the composite for time expansion due to skew.

Figure 14:
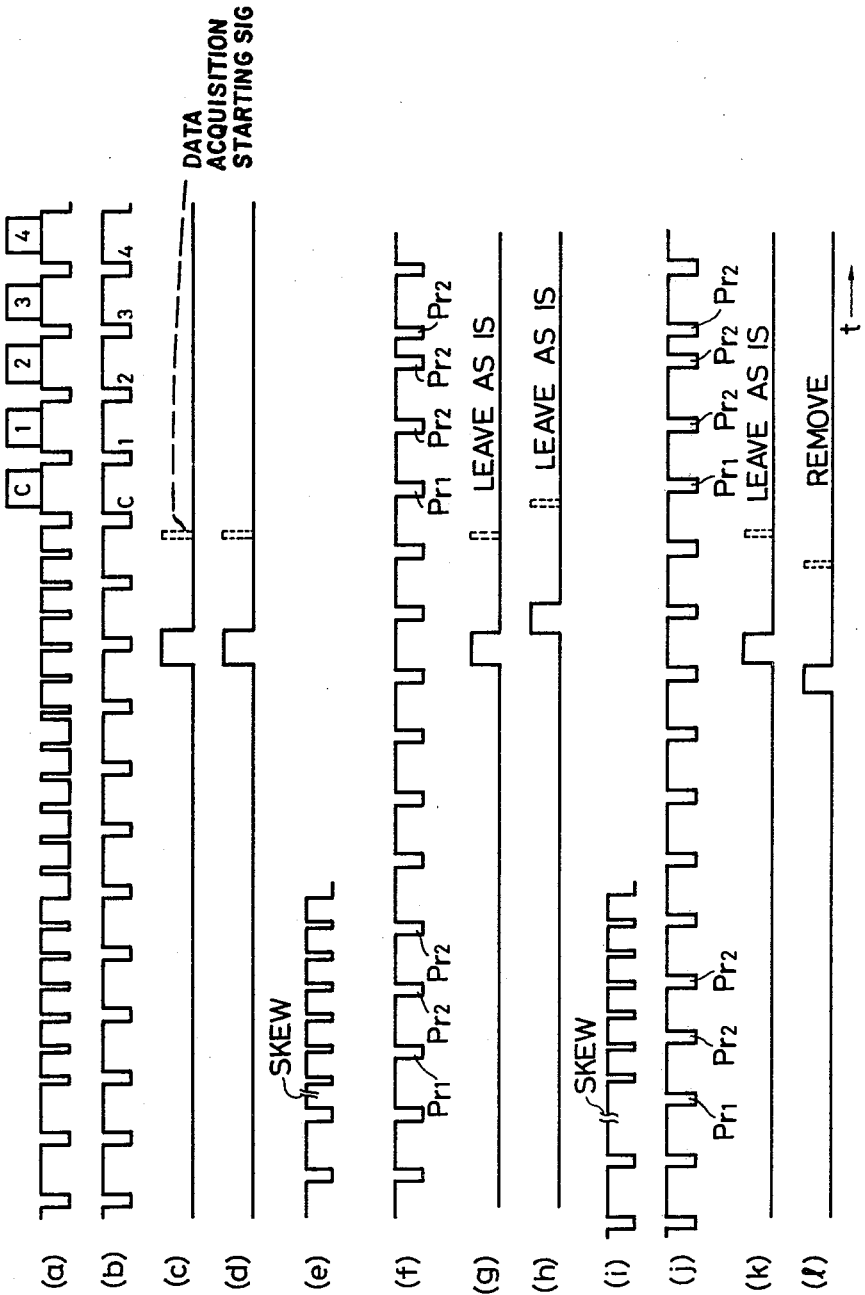
Figure 15:
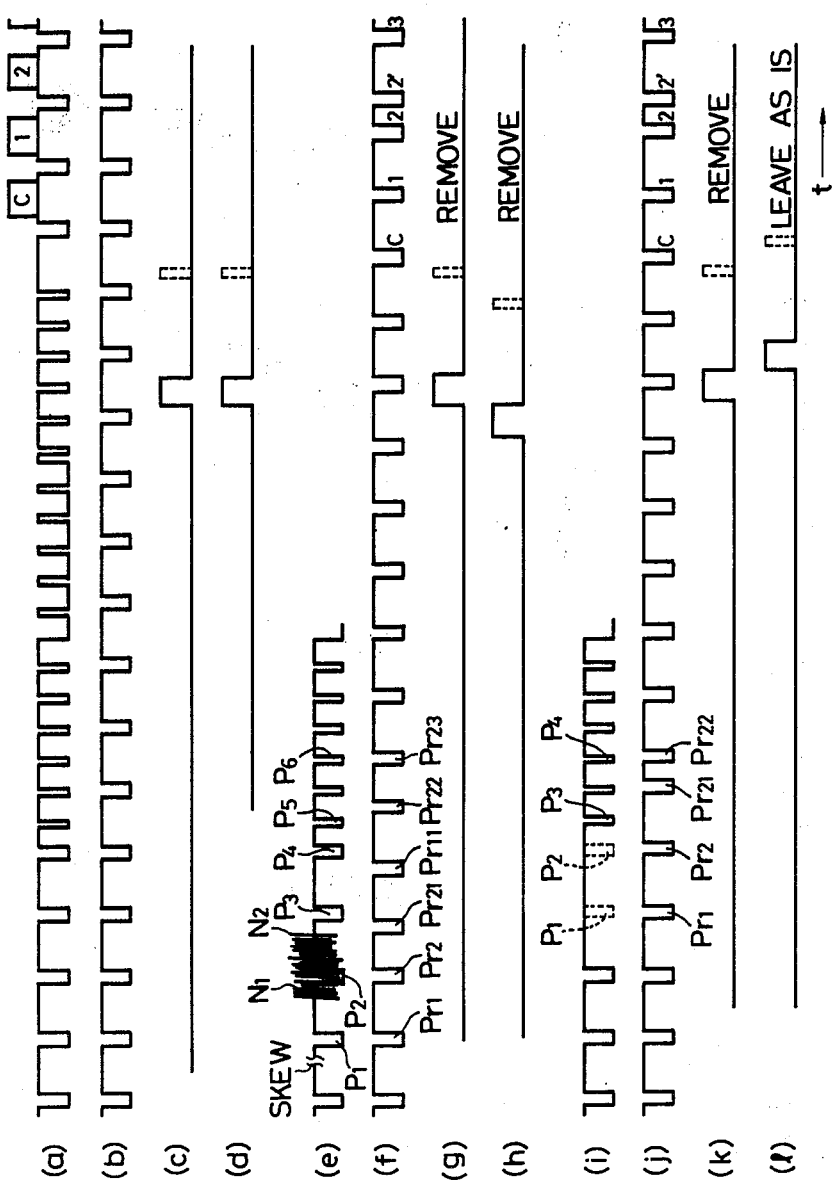
Figure 16:
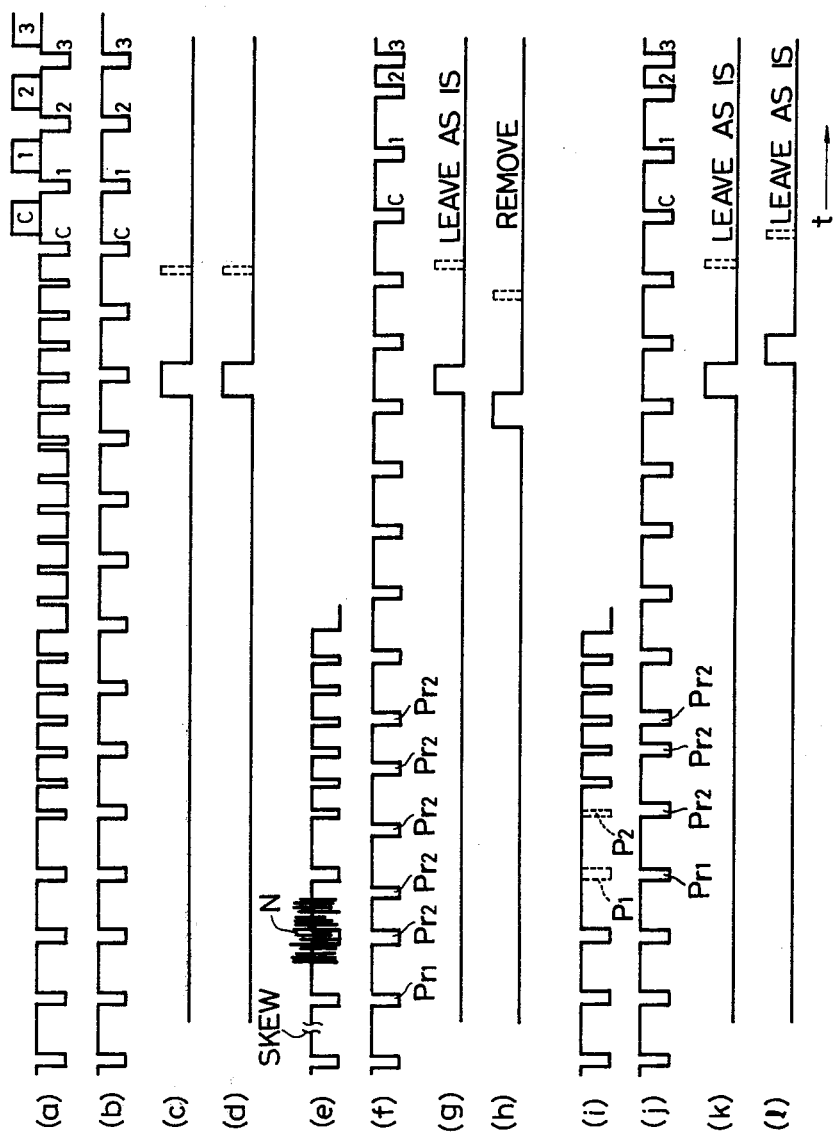

FIG. 14 is a timing chart due to assist in describing the switching operation from an even to an odd field, and FIG. 15 is a timing chart to assist in describing the switching operation from an odd to an even field. Waveforms (e) to (h) in FIG. 15 assist in describing the operation if a specific pattern noise has been mixed with the composite synchronous signal Sc (waveforms (e) to (h) of FIG. 16 are shown for the same purpose). Waveforms (i) to (l) of FIG. 15 assist in describing the operation if a portion of the composite synchronous signal Sc has been dropped from a specific pattern (waveforms (i) to (l) of FIG. 16 are shown for the same purpose). FIG. 16 is a timing chart of waveforms in the vicinity of the V. synch to assist in describing the switching operation from an odd to an even field.

In FIGS. 13 to 16, the waveforms (a), (e) and (i) are for the composite synchronous signal Sc; waveforms (b), (f) and (j) are the produced H. synch; waveforms (c), (g) and (k) are the pattern V. synch; and waveforms (d), (h) and (l) are supplementary V. synch.

The dotted line pulses in the waveforms (c), (d), (g), (h), (k) and (l) of FIGS. 13 to 16 cause data acquisition preparation, and are referred to as data acquisition starting pulses. Each of the data acquisition starting pulses is produced a predetermined interval after the V. synch (i.e. the pattern V. synch of the supplementary synchronous signal) emitted from the output terminal 28 of FIG. 2. Signal processing of PCM signals is performed such that PCM data acquisition is started using an initial H. synch after the data fetching starting pulse has been produced as a reference. The acquisition operation is terminated when a given number of H. synch pulses has been counted, where the given number is expressed by (the number of blocks of control signal=1)+(the number of data words=245). In the above, the control signal carries information indicative of the way in which the the PCM signal is reproduced or decoded. Since the PCM data is read in as statedabove, when the data acquisition fetching starting pulse is undesirably shifted from the correct position or when the H. synch pulse is erroneously produced, the arrangement and or order of the reproduced data, which have been processed by an interleaving technique, would be confused, resulting the occurrence of abnormal sounds. In the waveforms (a) of FIGS. 13 to 16, the reference C indicates the above-mentioned control signal block, and 1, 2, 3 . . . indicate the data words. The control signal includes information necessary for reproducing or decoding the data words.

In FIG. 13, the waveform (e) indicates that a portion of the composite synchronous signal Sc has shrunk due to skewing. The producing condition of the H. synch under the above-mentioned condition is shown by the waveform (f), the position of the pattern V. synch is shown by the waveform (g), and the position of the supplementary V. synch is shown by the waveform (h). The waveform (e) is shown such that the composite synchronous signal Sc prior to the skew occurrence has been shifted to the right in the drawing so that comparison with the normal position shown by the waveforms (a) to (d) is facilitated.

It is described hereafter that the produced H. synch pulse is shifted by H/2 from a normal H. synch pulse as shown by the waveform (f) of FIG. 13 when shrinking due to skew has occurred. An H. synch pulse P1 of the waveform (e) of FIG. 13 cannot be read in because the time interval between P1 and a former H. synch pulse has shrink due to skew, and thus, a first supplementary H. synch pulse Pr1 is emitted.

An equalizing pulse P3 cannot be read in although it was aimed to read the same, so that a second supplementary H. synch pulse Pr2 is emitted. Then, when a time interval from the detection of a pulse P4 to the detection of a pulse P6 has been measured, the pulse P6 is read in since the measured interval just equals 1H. However, since the second supplementary H. synch pulse Pr21 has already been emitted slightly before the emission of the pulse P6, a H. synch pulse is emitted simultaneously with the leading, i.e., negative going, edge of a pulse P7. The H. synch pulses produced in this way as shown in the waveform (f) of FIG. 13 are lagging behind the H. synch pulses of the waveform (b) of FIG. 13 by H/2. Therefore, the normal synchronous pulse P8 cannot be read in as a matter of course in the absence of equalizing pulses after the vertical blanking interval, and thus, a first supplementary H. synch pulse Pr11 and a second supplementary H. synch pulse Pr22 are emitted as a result.

Next, a pulse P9 is detected, and an interval till a pulse P10 is measured, while a second H. synch pulse Pr23 is emitted to detect that the interval is just equal to 1 H. Thus, the pulse P10 is read in to emit a sound supplementary H. synch pulse Pr24 synchronous with the pulse P10. After pulse P10 has been derived, H. synch pulses synchronous with the original H. synch pulses of the composite synchronous signal Sc are produced.

When the H. synch is produced in this way, although the position of the data acquisition starting pulse is the same as in a normal case if the V. synch emitted from the continuous output preventing circuit 24 of FIG. 2 was produced by the pattern V. synch, an extra H. synch pulse is additionally produced thereafter, resulting in confusion in the order of data acquisition. If the V. synch emitted from the continuous output preventing circuit 25 is produced by the supplementary V. synch, the number of the H. synch pulses is correct although the position of the data acquisition starting pulse is behind the correct position thereof by H/2 due to the H/2 delay of the H. synch.

Waveforms (i) to (l) of FIG. 13 are for an interval between pulses at a portion of the composite synchronous signal Sc has been expanded due to skew. The waveform (i) indicates the composite synchronous signal Sc in the case of expansion due to skew; the waveform (j) causes the H. synch pulses to be produced if there is expansion due to skew; the waveform (k) is the pattern V. synch; and (l) is the supplementary V. synch. In the waveform (i), the composite synchronous signal Sc, as subsists before the occurrence of skew, is shifted in the left direction in the diagram to facilitate comparison with the normal positions of the waveforms (a) to (d).

If expansion occurs in the composite synchronous signal due to skew, the produced H. synch would be configured as the waveform (j) of FIG. 13, as described hereafter. The H. synch pulse P1 in the waveform (i) of FIG. 13 cannot be read in because the time interval between the pulse P1 and a former H. synch pulse is excessively long due to skew. Therefore, a first supplementary H. synch pulse Prj1 is emitted as shown by the waveform (j) of FIG. 13. Then equalizing pulse P2 of waveform (i) is detected to initially emit a second supplementary H. synch pulse Prj2. An interval subsists till a pulse P4 is measured to detect that this interval just equals 1H. A second supplementary H. synch pulse Prj21 synchronous with the pulse P4 is emitted. After pulse P4 has been derived, H. synch pulses synchronous with pulses P6 and P7 are sequentially emitted in advance of normal H. synch pulses by H/2. If no equalizing pulse occurs during the vertical blanking interval, H. synch pulses are produced in the same manner as described with reference to waveforms (e) to (h) of FIG. 13 in connection with the case that skew occurs in the composite synchronous signal Sc.

Now assume that: (1) the H. synch pulses are produced in the above-described manner, (2) the position of the data acquisition starting pulse is the same as in a normal case, and (3) the V. synch emitted from the continuous output preventing circuit 25 of FIG. 2 was produced by the pattern V. synch. Under these conditions an extra H. synch pulse is produced thereafter, resulting in confusion of the data acquisition order. If the V. synch emitted from the continuous output preventing circuit 25 was produced by the supplementary V. synch, the data acquisition starting pulse is emitted at a position H/2 in advance of a normal position since the H. synch pulse is in advance by H/2. In this case an extra H. synch pulse is produced, resulting in confusion of the data fetching order.

The waveforms (a) to (l) of FIG. 14 show a problem of switching from an even to an odd field. The H. synch pulses, which are shifted by H/2, are produced in the same manner as in the case of FIG. 13. The state of confusion of the acquisition order data, which is caused by the position of the data acquisition starting pulse, varies in accordance with the direction and amount of skew. In FIG. 14, the first and second supplementary H. synch pulses are respectively Pr1 and Pr2.

Next, assume that a specific noise pattern has been mixed with the composite synchronous signal Sc in the vicinity of the V. synch or that the synchronous signal has dropped out of a specific pattern, although such cases are very unusual.

In FIG. 15, for the case of switching from an odd to an even field, the wave form, (e) is the composite synchronous signal in which a specific noise pattern has been mixed in the vicinity of the V. synch; the waveform (f) indicates the condition that produces H. synch pulses; the waveform (g) is the pattern V. synch; and the waveform (h) is the supplementary V. synch.

When the H. synch pulse P1 of the waveform (e) of FIG. 15 is not detected due to a small amount of skew or the like, a first supplementary H. synch pulse Pr1 is emitted. Then, when a detecting operation is started before the time interval 1H-ΔH having lapsed in order to detect a pulse P2, if noise N1 happens to be detected, a second supplementary H. synch pulse Pr2 is emitted. Noise variation N2, spaced by approximately 1H, is also detected. As a result, a second supplementary H. synch pulse Pr21, synchronous with the noise N2, is undesirably emitted. After an interval 1H has lapsed after the noise variation N2, pulse P4 cannot be detected. Therefore, a first H. synch pulse Pr11 is again emitted, and the detecting operation is started before the end of the time interval 1H-ΔH. Thus, a pulse P5 is accidentally detected to emit a second supplementary H. synch pulse Pr22, while an equalizing pulse P6 spaced by 1H is detected. Accordingly, H. synch pulses advanced by H/2 from the normal position are produced thereafter in the same manner as in the case of expansion skew, which has been described in connection with FIG. 13.

The waveform (i) of FIG. 15 shows that a portion of the composite synchronous signal Sc has dropped out in the vicinity of the V. synch; the waveform (j), produces H. synch pulses under this condition. In this case, since a pulse has been dropped as shown in the waveform (i), the pulse P1 cannot be detected. Therefore, a first supplementary H. synch pulse Pr1 is emitted. Since a following pulse P2, which has also been dropped, cannot be detected, a second supplementary H. synch pulse Pr2 is emitted. After this, a pulse P3 is detected to emit a second supplementary pulse Pr21. Then a second H. synch pulse Pr22 synchronous with equalizing pulse P4, is emitted by detecting the equalizing pulses P4 which are spaced by 1H. After this, H. synch pulses, which are synchronous with the synchronous pulses of the waveform (i) and are shifted by H/2, are emitted.

In the waveform (j) of FIG. 15, the second supplementary H. synch pulse Pr22 synchronous with the pulse P4 of the waveform (i) is spaced from the former second supplementary H. synch pulse Pr21 by approximately H/2 (H/2 to 5H/8). Pulse Pr22 is therefore invalid with respect to the H/2 pulse producing circuit 27 of FIG. 2, so no H/2 pulse is produced. Therefore, the position where the supplementary V. synch is produced is H/2 behind the normal position (see the waveform (d) of FIG. 15) therefore, the same results as in the case of skew due to shrinking, as described with reference to FIG. 13, are obtained.

The waveforms (a) to (l) of FIG. 16 show a problem in the case of switching from an even to an odd field; the produced H. synch pulses of FIG. 16 are shifted by H/2 in the same manner as in the case of FIG. 15. In the case of noise mixing of the waveforms (e) to (h) of FIG. 16, the same phenomena as that in the case of skew due to expansion of the waveforms (i) to (l) of FIG. 14 occur. In the case of dropout of the synchronous signal in the vicinity of V. synch of the waveforms (i) to (l), the same phenomena as that in the case of skew due shrinking of the waveforms (e) to (h) of FIG. 14 occur. In FIG. 16, there are waveforms including noise N, dropped synchronous pulses P1 and P2, first and second as well as supplementary H. synch pulses Pr1 and Pr2.

From the above detailed description, the circuit arrangement of FIG. 11 suffers from a problem that the order of PCM data fetching can cause abnormal sounds when a relatively great skew exists in the vicinity of the V. synch of the composite synchronous signal Sc, or when a specific noise pattern has been mixed therein or the synchronous signal has been dropped from a specific pattern.

The inventors of the present invention, therefore, have provided another circuit arrangement, described hereafter as a second embodiment of the present invention, in order to remove the problem inherent to the above described first embodiment. According to the second embodiment shrinking and expansion of the synchronous signals due to skew and/or noise mixing are detected; there is also detection of whether the field is odd or even. A control mode can be changed in accordance with the results of the above detection, so that a correct number of synchronous pulses is produced in a section where data exists.

To fetch the PCM data in correct order, it is necessary to suitably process the second supplementary H. synch pulse which occurs when the system returns to the condition that the produced H. synch pulses synchronously with the input original H. synch pulses, after the supplementing interval which follows the vertical blanking interval.

Figures 17, 21:
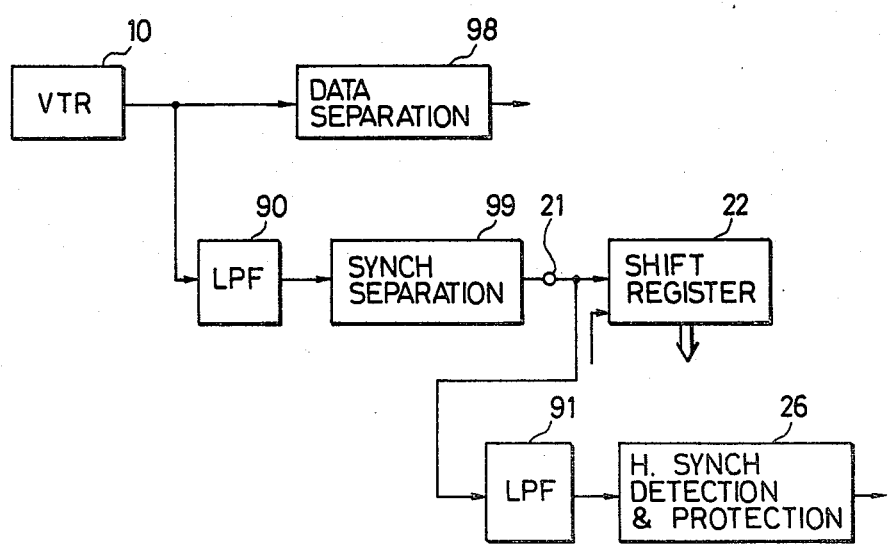
FIG. 17 is a table of the operation of a second embodiment of the H. synch protecting circuit according to the present invention.
FIG. 21 is a schematic block diagram of an improved PCM signal reproducing system according to the present invention.

FIG. 17 is a table of the details of processing the above-mentioned second supplementary H. synch pulse. In FIG. 17, "RESULTS OF SHRINKING/EXPANSION DECISION" is the result of detecting whether the interval between adjacent H. synch pulses affected by skew is longer or shorter than 1H. In the case of noise mixing and dropout of the synchronous signal, the processing details are the same as in the case of skew as is apparent from the description in connection with FIGS. 13 to 16. As described later, a check is made to determine whether the shrinking/expansion is caused by noise or dropout of the synchronous signal by a detecting circuit which determines shrinking/expansion due to skew in the same manner.

Determination of whether the H. synch has expanded (or noise mixing) or shrink (dropout of synchronous signal) is achieved by checking the condition that produces a second supplementary H. synch pulse (last second supplementary H. synch pulse) which occurs immediately before return to complete synchronization between the produced H. synch pulses and the H. synch pulses of the input composite synchronous signal Sc; the return to complete synchronization is after using the supplementary H synch pulses.

The above-described determination can be achieved because the ultimate second supplementary H. synch pulse is (1) synchronous with an H. synch pulse of the input composite synchronous signal Sc if the time interval between adjacent H. synch pulses has been expanded, (2) not synchronous with an H. synch pulse of the input composite synchronous signal Sc, in the case of shrinking.

Turning back to FIGS. 11 and 12, a supplementing condition of the H. synch pulses can be detected from the switching control signal 62a having waveform (o) of FIG. 12; the last second supplementary H. synch pulse can be detected from the counted value of the counter circuit 38 at the occurrence time of the differential pulse 50a in the output signal 52a of the second AND gate 52 (see the waveform (k) of FIG. 12).

Figure 18:
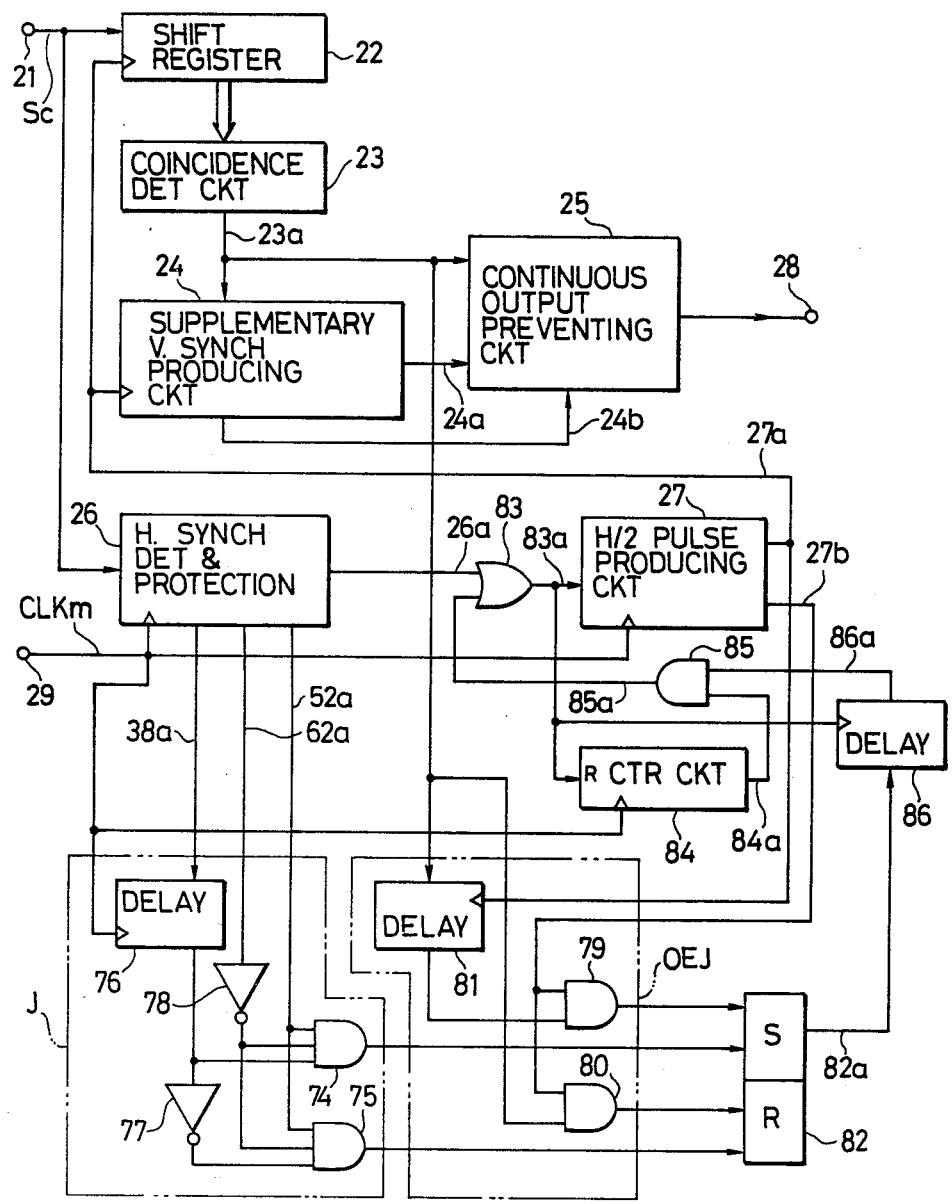
FIG. 18 is a detailed circuit diagram of the second embodiment.

Hence, reference is now made to FIG. 18, block diagram of the second embodiment circuit in which shrinking/expansion of the H. synch is detected according to the above-described manner.

The circuit of FIG. 18 includes a shrinking/expansion determining circuit J, enclosed by a dotted line, in addition to various circuits of FIG. 2. The shrinking/expansion determining circuit J comprises two AND gates 74 and 75, a delay circuit 76 and two inverters 77 and 78. The delay circuit 76 slightly retard a determination reference signal 38a shown by a waveform (d) of FIG. 19, obtained by suitably decoding the output data of the counter circuit 38. The master clock pulse signal CLKm is applied to the delay circuit 76 as a clock signal. Since the counter circuit 38 of FIG. 11 is reset by the differential pulse 50a applied as the output pulse 52a of the second AND gate 52 thereto, the delay circuit 76 temporarily stores the preset data of the counter circuit 38.

The inverter 78 is responsive to the output signal 62a of the switching control signal generating circuit 66 of FIG. 11, which signal indicates whether or not there is a supplementing condition. With this arrangement, the AND gate 74 emits a pulse for detecting shrinking, while the AND gate 75 emits a pulse for detecting expansion.

Next, the method of judging whether the field is odd or even is described. Various methods for determining odd/even fields have been known hitherto. In this embodiment, odd/even field determination is performed by utilizing the relationship between a determining pulse 27b from the H/2 pulse producing circuit 27, which derives waveform (c) of FIG. 19 and the pattern V. synch shown in the waveforms (c), (g) and (k) of FIGS. 13 to 16.

A field is detected as an even field if the determining pulse 27b occurs in the interval of the pattern V. synch having a pulse width of H/2; the field is detected as an odd field if the determining pulse 27b occurs in the interval of a signal which has been retarded by H/2 from the pattern V. synch. The entries under "RESULTS OF ODD/EVEN DETERMINATION" in FIG. 17, showing the results obtained in the above-described manner, indicate the results to be opposite to a normal case.

The second embodiment circuit arrangement comprises an odd/even determination circuit OEJ including AND gates 79 and 80, as well as delay circuit 81. The delay circuit 81 retards the pattern V. synch 23a by H/2 using the H/2 pulse signal 27a as its clock. AND gates 79 and 80 respectively emit determining pulses for odd and even fields.

It is described hereafter how the H. synch pulse 26a is processed in accordance with the details of the results of shrinking/expansion determination and the results of odd/even field determination. The last of the second supplementary H. synch pulses is either removed or left as it is in accordance with the even or odd decision. The last of the second supplementary H. synch pulses occurs when there is a return to the synchronous condition of the produced H. synch pulses and the H. synch pulses of the input composite synchronous signal Sc after the supplementing period which follows the vertical blanking interval. Therefore, pulse 26a requires an interval of several H's to 10H from the point of determination till the execution of the processing. For this reason, the results of the determination are temporarily stored to either remove or emit the H. synch pulses (see the waveform (a) of FIG. 20), which have been produced at an interval of substantially H/2, as it is thereafter. In FIG. 18, the flip-flop 82 stores the results of the determination temporarily, and is reset by the results of the odd/even field determination; flip-flop 82 is set by the results of the determination which is necessary for processing.

Circuit 84 produces a gate control signal 84a (waveform (b) of FIG. 20). Circuit 84 comprises a counter, which is reset by the processed H. synch pulse to start counting the number of master clock pulses CLKm, and a decoder. However, the circuit 84 may be replaced by H/2 pulse producing circuit 27 if desired.

AND gate 85 prevents H. synch pulses, which are not to be processed, from being removed by the gate control signal 84a. The delay circuit 86 operates in response to the trailing edge of the processed H. synch pulse so that the delay circuit derives input signal waveform (e) (FIG. 19) by retarding the waveform at the time shown by the waveform (f) of FIG. 19. The delay circuit 86 prevents the H. synch pulse occurring immediately after the flip-flop 82 has been set (decision for removing) from being removed.

The gate control signal 84a and the output signal from the delay circuit 86 obtained in this way are applied to the AND gate 85, having an output that is in turn applied to an OR gate 83. The output signal 85a of the AND gate 85, applied as a gate waveform (c) (FIG. 20) to OR gate 83, has one and zero levels when the pulse removing process takes place, and does not take place, respectively.

From the above description, it is apparent that a desired H. synch pulse train signal is obtained by the second embodiment circuit of FIG. 18.

Deviation or shifting of the H. synch pulses due to a specific noise pattern can be prevented by using a circuit having a relatively simple structure as described with reference to the circuit of FIG. 21. The circuit of FIG. 21 includes data separating circuit 98 which extracts digital data from the reproduced signal of the VTR 10. Terminal 21, shift register 22 and circuit 26 respectively correspond to those elements of FIG. 18. Low pass filter 90 is provided in a transmission line for a signal from which the composite synchronous signal Sc has not been separated yet, while the second low pass filter 91 is provided in a transmission line for the composite synchronous signal Sc, as derived from a synchronous signal separation circuit 99. Although the two above-mentioned low pass filters 90 and 91 are employed in the circuit of FIG. 21, one of these low pass filters may be omitted in practice, if desired, and the noise eliminating effect is still adequate even if only one low pass filter is used.

Noise included in the reproduced signal raises a problem when the noise resides in a specific pattern; namely, when the noise occurs at an interval corresponding substantially to 1H; therefore, if a low pass filter is inserted in the transmission line of the composite synchronous signal Sc before the composite synchronous signal Sc is applied to the input of the H. synch generating circuit 26, the specific noise pattern can be completely eliminated, preventing the undesirable shifting of the H. synch pulses due to the noise.

From the foregoing description, it is understood that the number of produced H. synch pulses in the second embodiment circuit arrangement of FIG. 18 is correct since the second supplementary H. synch pulses are controlled by determining shrinking/expansion and odd/even field of the composite synchronous signal Sc. As a result, the occurrence of abnormal sounds due to confusion of the data fetching order caused by the skew in the vicinity of the V. synch, noise mixing or by drop-out of the synchronous signal is effectively prevented.

The above-described embodiments are just examples of the present invention, and therefore, it will be apparent for those skilled in the art that many modifications and variations may be made without departing from the spirit of the present invention.

What is claimed is:

1. A horizontal synchronous signal protecting circuit for use with a pulse code modulated signal decoding apparatus which decodes a pulse code modulated signal accompanied by horizontal synchronous pulses which were originally added at a predetermined interval, comprising:
   (a) a horizontal synchronous signal detecting circuit responsive to an input signal carrying said horizontal synchronous pulses for detecting said horizontal synchronous pulses and for deriving detected horizontal synchronous pulses when each horizontal synchronous pulse appears within a predetermined time interval;
   (b) a first horizontal synchronous pulse adding circuit responsive to the output pulses of said horizontal synchronous signal detecting circuit for supplementing the absence of a horizontal synchronous signal with a first supplementary horizontal synchronous pulse in the absence of a horizontal synchronous pulse in said composite synchronous signal;
   (c) a second horizontal synchronous pulse adding circuit including a free-running counter, said free-running counter being reset to zero in response to a horizontal synchronous pulse from said horizontal synchronous signal detecting circuit, said second horizontal synchronous pulse adding circuit producing second supplementary horizontal pulses; and
   (d) an output switching circuit for selectively supplying one of the output signals of said horizontal signal detecting circuit and said first and second horizontal synchronous pulse adding circuits in accordance with the number of horizontal synchronous pulses dropped from said input signal; said output switching circuit deriving a first supplementary horizontal synchronous pulse from said first horizontal synchronous pulse adding circuit when the dropped pulse number is one, and deriving said second horizontal synchronous pulses from said second horizontal synchronous pulse adding circuit when the horizontal synchronous pulses of said input signal have been continuously dropped.

2. A horizontal synchronous signal protecting circuit as claimed in claim 1, wherein said second horizontal synchronous pulse adding circuit comprises a counter, a decoder responsive to the counted number of said counter, and a reset circuit responsive to the output pulse of said horizontal signal detecting circuit and to the output signal of said decoder, the output signal of said reset circuit being applied to a reset terminal of said counter.

3. A horizontal synchronous signal protecting circuit as claimed in claim 1, further comprising means for determining whether the interval between adjacent horizontal synchronous pulses derived from said horizontal synchronous signal detecting circuit which occur when the horizontal synchronous pulses from said output switching circuit return to synchronization with the horizontal synchronous pulses of the input signal, is longer or shorter than a predetermined value; and a circuit responsive to information from the determining means for removing an initial pulse of said second supplementary pulses, which appears at the time of returning to said condition, when said initial pulse is within a predetermined time interval.

4. A horizontal synchronous signal protecting circuit as claimed in claim 1, further comprising a low pass filter at an input of said protecting circuit.

5. A method of protecting a horizontal synchronous signal of a pulse code modulated signal derived from a recording medium, which signal has been recorded in the form of a standard television signal with an interleaving technique by converting an analog signal into a pulse code modulated signal and by mixing the pulse code modulated signal with a synchronous signal based on a scanning standard of the standard television system, said method including a step of adding first and second supplementary horizontal synchronous pulses in such a manner that the first supplementary horizontal synchronous pulse is added when a horizontal pulse of the synchronous signal is not detected, and the second supplementary horizontal pulses are added when horizontal pulses of the synchronous signal are not detected continuously, said method comprising the steps of:
   (a) determining whether the interval between adjacent horizontal synchronous pulses of said synchronous signal at the time of returning from a condition that horizontal synchronous pulses are added to a condition of synchronizing with the horizontal synchronous pulses of the synchronous signal is longer or shorter than a predetermined value and;
   (b) removing an initial pulse of said second supplementary pulses, which initial pulse appears at the time of returning to said condition, the initial pulse being removed in response to the results of the determining step when said initial pulse occurs within a predetermined time interval.

6. A circuit arrangement for controlling horizontal synchronous pulses in an apparatus which decodes a pulse code modulated signal accompanied by horizontal synchronous pulses which were originally added at a predetermined interval, comprising:
   (a) a horizontal synchronous pulse signal detecting circuit for deriving an output including each horizontal synchronous pulse only when each horizontal pulse appears within a predetermined time interval;
(b) means responsive to the output from said detecting circuit for generating a pulse in response to the absence of each of said horizontal synchronous pulses within said predetermined time interval;
(c) a first horizontal synchronous pulse generating circuit responsive to said pulse from said generating means for producing a first supplementary synchronous pulse to supplement an absence of one horizontal synchronous pulse;
(d) a second horizontal synchronous pulse generating circuit having a self-resetting counter periodically counting a master clock frequency having a predetermined relationship with the frequency of the horizontal synchronous pulses, said self-resetting counter being reset to zero in response to every detected horizontal synchronous pulse from said detecting circuit and said second horizontal synchronous pulse generating circuit producing second supplementary horizontal synchronous pulses to supplement a consecutive absence of the horizontal synchronous pulses; and
(e) an output switching circuit for deriving:
(e1) the output horizontal synchronous pulses from said detecting circuit;
(e2) the first supplementary horizontal synchronous pulse from said first horizontal synchronous pulse generating circuit when the number of absent horizontal synchronous pulses is one, and
(e3) the second supplementary horizontal synchronous pulses from said second horizontal synchronous pulse generating circuit when the horizontal synchronous pulses are consecutively absent.

* * * * *